(12) United States Patent
Zhang et al.

(10) Patent No.: US 11,894,285 B2
(45) Date of Patent: Feb. 6, 2024

(54) BACK PLATE ASSEMBLY AND ELECTRONIC DEVICE

(71) Applicant: Tyco Electronics (Shanghai) Co. Ltd., Shanghai (CN)

(72) Inventors: Jiefeng Zhang, Shanghai (CN); Zhiqiang Li, Shanghai (CN); Biaobing Lv, Shanghai (CN); Guoxiao Shen, Shanghai (CN); Wei Zhao, Shanghai (CN); Jinqiang Wang, Qingdao (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/090,969

(22) Filed: Nov. 6, 2020

(65) Prior Publication Data
US 2021/0143083 A1 May 13, 2021

(30) Foreign Application Priority Data
Nov. 8, 2019 (CN) .......................... 201911087320.4

(51) Int. Cl.
*H01L 23/40* (2006.01)
*H01L 23/367* (2006.01)
*H05K 7/10* (2006.01)

(52) U.S. Cl.
CPC ........ *H01L 23/4006* (2013.01); *H01L 23/367* (2013.01); *H05K 7/1061* (2013.01); *H01L 2023/4037* (2013.01); *H01L 2023/4087* (2013.01)

(58) Field of Classification Search
CPC ....... H01L 23/40–4006; H01L 23/4093; H01L 23/4081; H01L 23/4087; H01L 23/4037; H01L 23/405; H01L 23/367; H01L 2023/4037; H01L 2023/405; H01L 2023/4075–4087; H01L 2023/4043; H01L 2023/4062; H01L 2023/4081; H05K 7/1061; H05K 7/2039; H05K 7/2049; H05K 7/20154; H05K 7/20509; H05K 1/18; H05K 1/0201–0203; H05K 3/326; F16B 21/00
See application file for complete search history.

(56) References Cited

U.S. PATENT DOCUMENTS

| | | | | |
|---|---|---|---|---|
| 5,262,925 A | * | 11/1993 | Matta | H01L 23/32 174/535 |
| 5,519,331 A | * | 5/1996 | Cowart | G01R 1/0408 324/756.02 |
| 6,229,706 B1 | * | 5/2001 | Cook | H01L 23/4093 24/458 |
| 6,545,352 B1 | * | 4/2003 | Ruckdeschel | H01L 23/3677 257/706 |
| 6,633,485 B1 | * | 10/2003 | Sigl | H01L 23/4093 257/727 |

(Continued)

*Primary Examiner* — Amir A Jalali
(74) *Attorney, Agent, or Firm* — Barley Snyder

(57) ABSTRACT

A back plate assembly includes a base plate formed with a groove having a bottom wall and a pair of side walls opposite to each other in a first horizontal direction, and an arch plate assembled into the groove and having a pair of opposite ends in the first horizontal direction. A pair of end surfaces of the ends of the arch plate abut against the side walls and a part of a middle portion of the arch plate between the ends is not in contact with the bottom wall of the groove.

5 Claims, 7 Drawing Sheets

(56) References Cited

U.S. PATENT DOCUMENTS

| | | | |
|---|---|---|---|
| 2004/0132331 A1* | 7/2004 | Osborn | H01L 23/552 257/E23.114 |
| 2006/0087014 A1* | 4/2006 | Rubenstein | H01L 23/4006 257/678 |
| 2006/0139886 A1* | 6/2006 | Barsun | H01L 23/4006 361/704 |
| 2011/0031864 A1* | 2/2011 | Rebergen | F21V 19/04 313/11 |
| 2011/0110044 A1* | 5/2011 | Wei | H01L 23/4006 361/704 |
| 2012/0244742 A1* | 9/2012 | Wertz | H05K 7/1061 439/485 |
| 2013/0083504 A1* | 4/2013 | Fukuzono | H01L 23/4006 361/783 |
| 2013/0314877 A1* | 11/2013 | Watanabe | H05K 1/0203 361/719 |
| 2014/0153199 A1* | 6/2014 | Wang | H05K 7/1487 361/748 |
| 2016/0338198 A1* | 11/2016 | Ohsawa | H05K 1/18 |
| 2017/0325349 A1* | 11/2017 | Thompson | H05K 1/14 |
| 2020/0126889 A1* | 4/2020 | Mao | H01L 23/427 |
| 2020/0137896 A1* | 4/2020 | Elenitoba-Johnson | G06F 13/4221 |
| 2020/0170101 A1* | 5/2020 | Chien | H05K 1/0201 |
| 2021/0123687 A1* | 4/2021 | Lin | H05K 7/2039 |

\* cited by examiner

BACK PLATE ASSEMBLY AND ELECTRONIC DEVICE

CROSS-REFERENCE TO RELATED APPLICATION

This application claims the benefit of the filing date under 35 U.S.C. § 119(a)-(d) of Chinese Patent Application No. 201911087320.4, filed on Nov. 8, 2019.

FIELD OF THE INVENTION

The present invention relates to an electronic device and, more particularly, to a back plate assembly of the electronic device.

BACKGROUND

A central processing unit (commonly referred to as CPU) is usually mounted on a socket connector of a circuit board in a loaded manner. In order to ensure reliable electrical contact between a pin on the central processing unit and the socket connector, it is necessary to apply a sufficient loading or pressing force on the CPU. In order to prevent the circuit board from being crushed, it is also necessary to provide a back plate under the circuit board to support and protect the circuit board from being crushed.

As the function of the current CPU is becoming more and more powerful, the number of pins may reach tens of thousands, and thus the force required to be applied has also become greater. The current back plate only comprises a single back plate. When subjected to a large vertical loading force, the back plate will undergo an obvious elastic deformation in a vertical direction, which will cause the back plate to extrude downwards and cannot horizontally support and protect the circuit board. The circuit board may thus be broken due to excessive deformation in the vertical direction.

SUMMARY

A back plate assembly includes a base plate formed with a groove having a bottom wall and a pair of side walls opposite to each other in a first horizontal direction, and an arch plate assembled into the groove and having a pair of opposite ends in the first horizontal direction. A pair of end surfaces of the ends of the arch plate abut against the side walls and a part of a middle portion of the arch plate between the ends is not in contact with the bottom wall of the groove.

BRIEF DESCRIPTION OF THE DRAWINGS

The invention will now be described by way of example with reference to the accompanying Figures, of which.

DETAILED DESCRIPTION OF THE EMBODIMENTS

Figure 1:
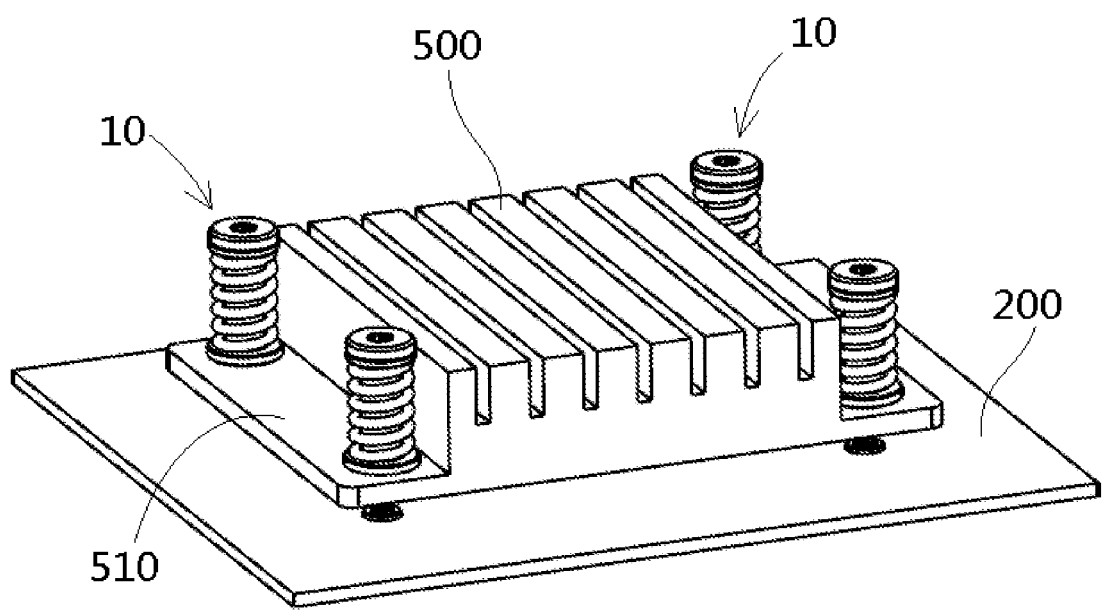
FIG. 1 is a top perspective view of an electronic device according to an embodiment.
Figure 2:
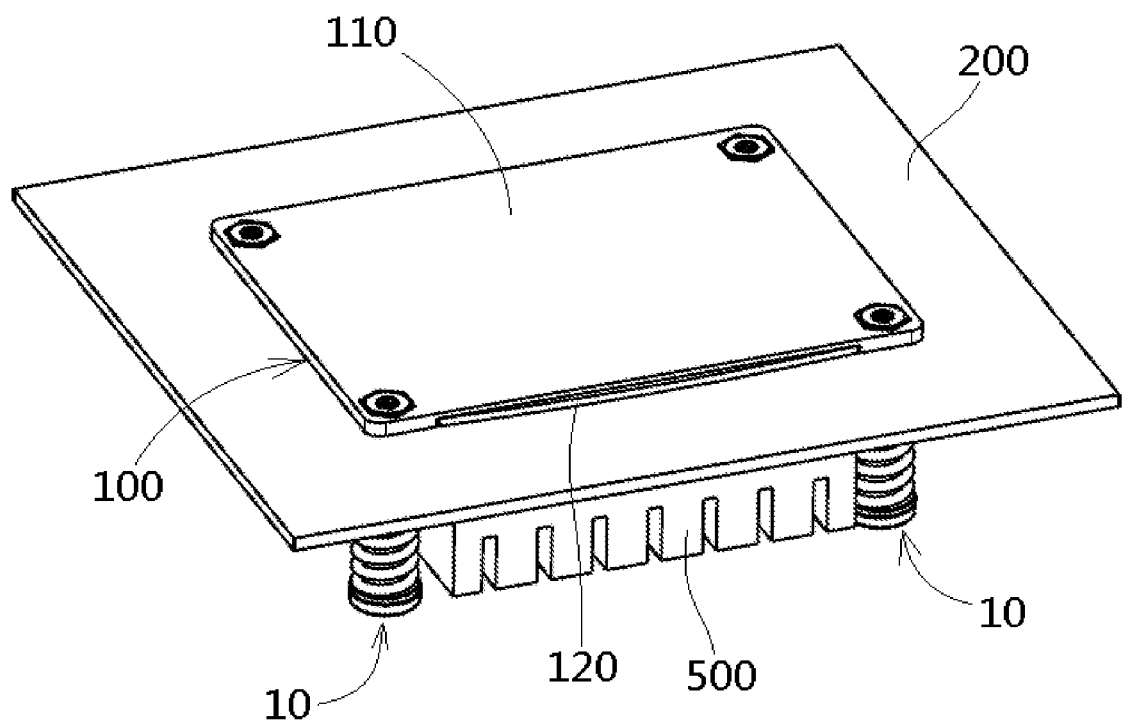
FIG. 2 is a bottom perspective view of the electronic device.
Figure 3:
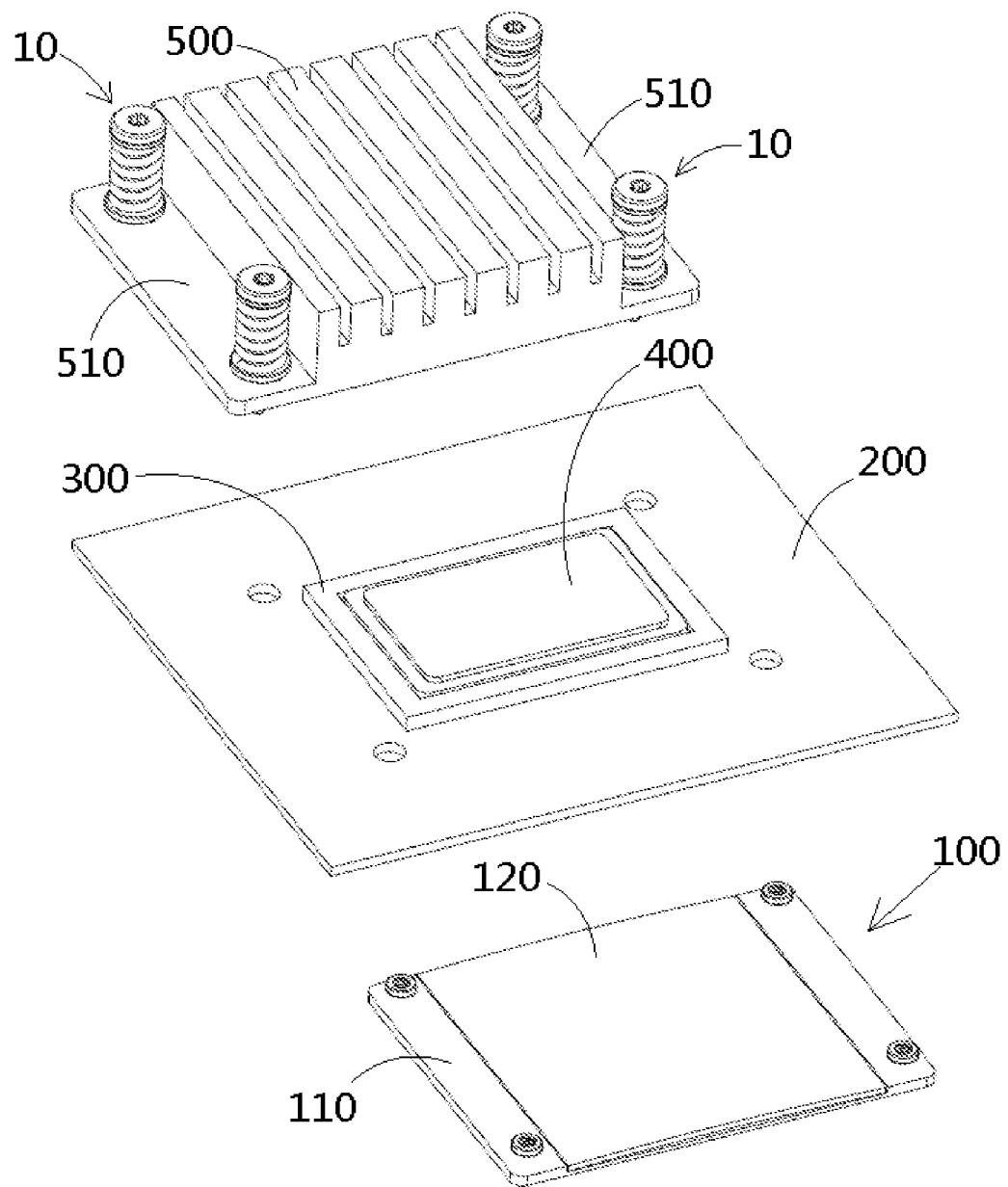
FIG. 3 is an exploded perspective view of the electronic device.
Figure 4:
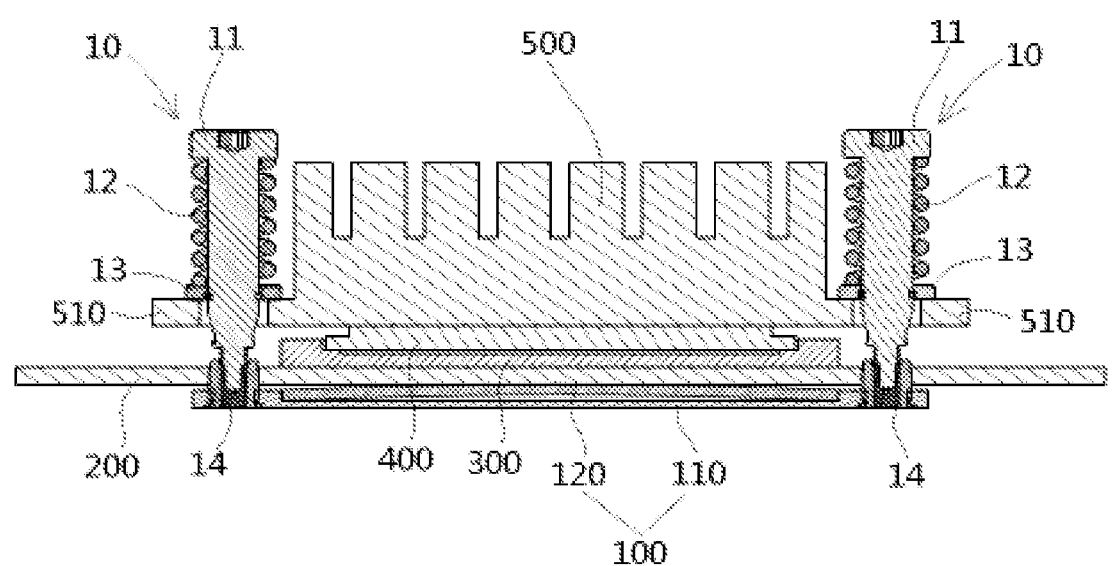
FIG. 4 is a sectional side view of the electronic device.

Technical solutions of the present disclosure will be described hereinafter in detail through embodiments and with reference to the attached drawings. In the specification, the same or the like reference numerals refer to the same or the like elements. The illustration of the embodiments of the present disclosure made with reference to the attached drawings is aimed to explain the general inventive concept of the present disclosure, and should not to be construed as a limitation to the present disclosure.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

As shown in FIGS. 1 to 4, in the illustrated embodiments, a back plate assembly 100 is used to support an electronic component (200, 300, 400, 500) mounted and pressed thereon.

Figure 5:
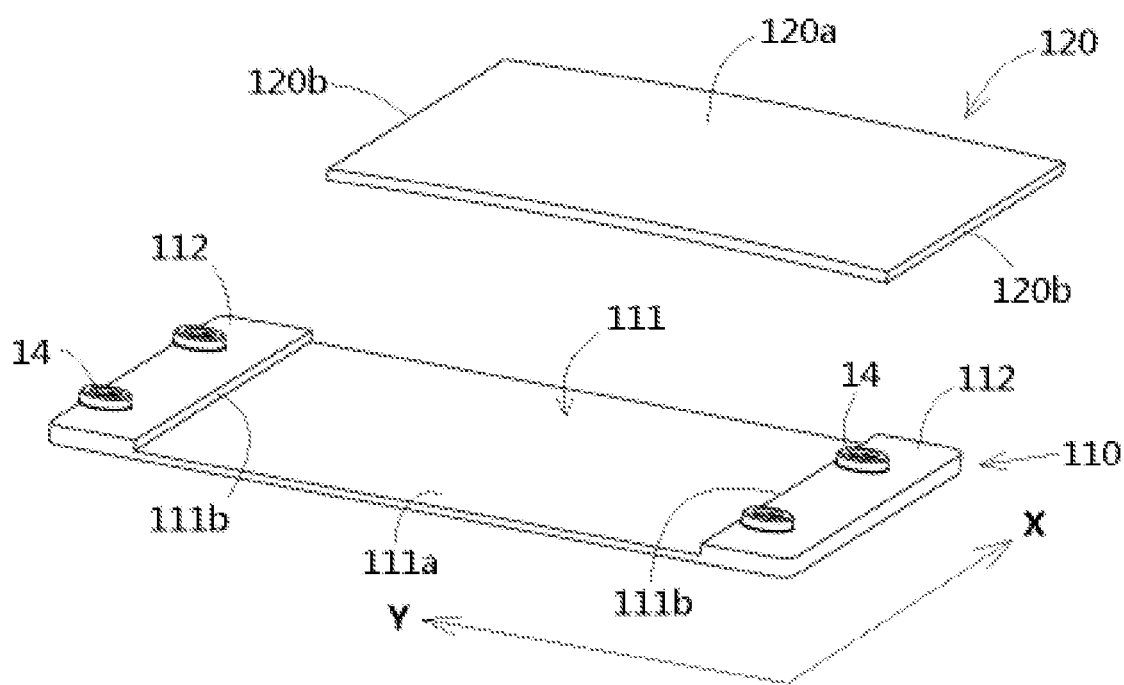
FIG. 5 is an exploded perspective view of a back plate assembly of the electronic device.
Figure 6:
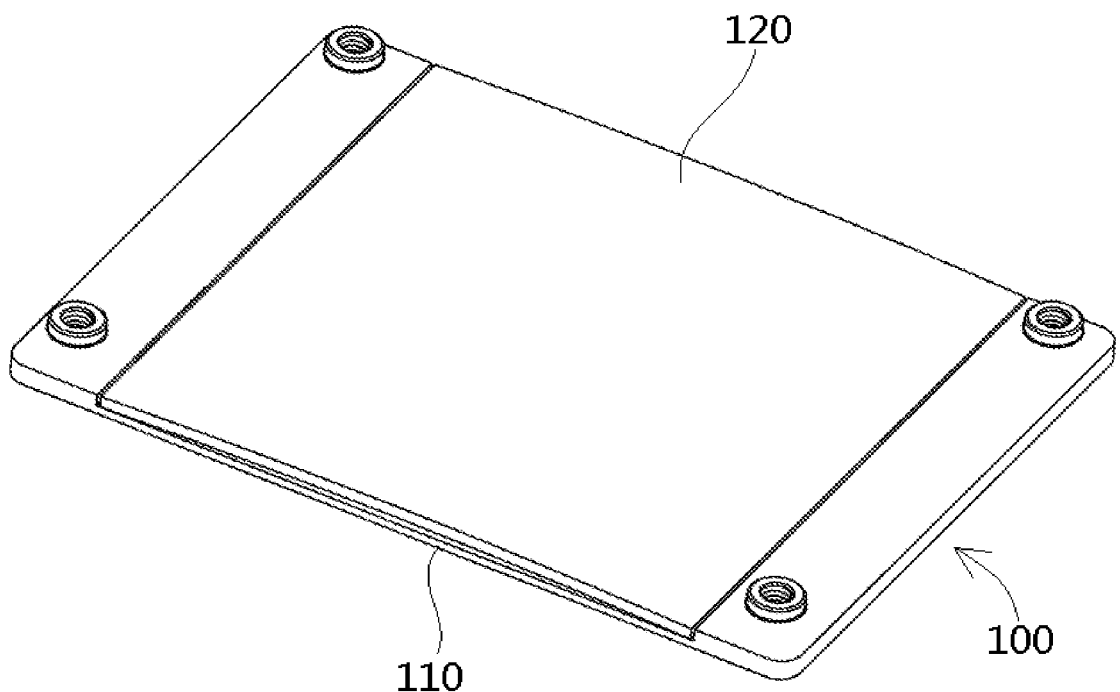
FIG. 6 is a perspective view of the back plate assembly.
Figure 7:
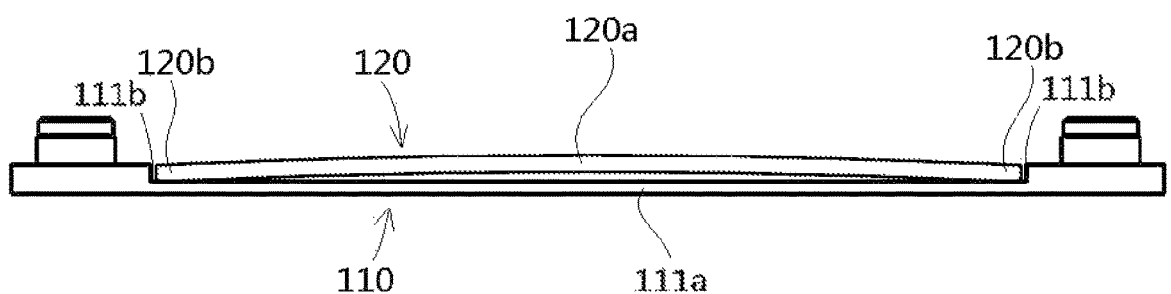
FIG. 7 is a side view of the back plate assembly.
Figure 8:
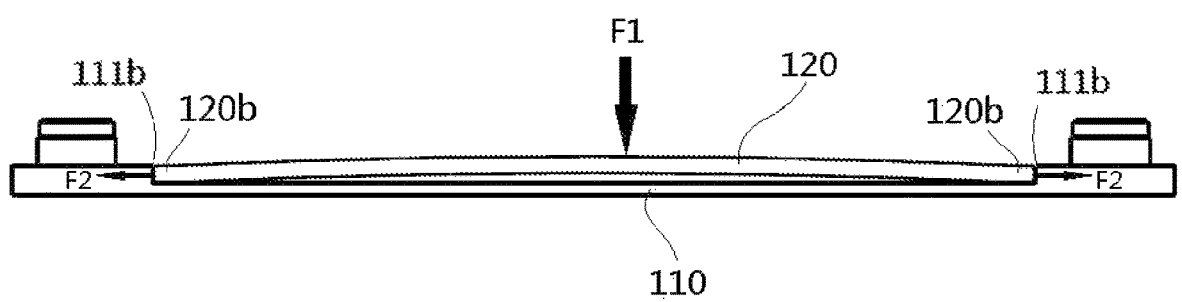
FIG. 8 is a side view of the back plate assembly in a state in which a vertical loading force is applied on the back plate assembly.

As shown in FIGS. 5 to 7, in the illustrated embodiments, the back plate assembly 100 mainly comprises a base plate 110 and an arch plate 120. The base plate 110 is formed with a recess or groove 111, which has a bottom wall 111a and two side walls 111b opposite to each other in a first horizontal direction Y. The arch plate 120 is adapted to be received and assembled into the groove 111 of the base plate 110. The arch plate 120 has two opposite ends 120b in the first horizontal direction Y. In the illustrated embodiment, the cross section of the arch plate 120 in the first horizontal direction Y is in an arch bridge shape with low ends and a high middle portion.

As shown in FIGS. 5 to 7, in the illustrated embodiments, when the arch plate 120 is assembled into the groove 111 of the base plate 110, end surfaces of the two ends 120b of the arch plate 120 abut against the two side walls 111b of the groove 111 respectively, and at least a part of a middle portion 120a of the arch plate 120 located between the two ends 120b does not contact with the bottom wall 111a of the groove 111.

As shown in FIGS. 5 to 8, in the illustrated embodiments, when a vertical pressing or loading force F1 is applied on the arch plate 120, the arch plate 120 is compressed and deformed in the vertical direction, such that the two ends 120b of the arch plate 120 will be moved outwardly in the first horizontal direction Y, resulting in that the two ends 120b of the arch plate 120 abut against the two side walls 111b of the groove 111 respectively. In this way, the vertical pressing or loading force F1 applied on the arch plate 120 is transferred into a horizontal tension F2 applied on the base plate 110.

As shown in FIGS. 5 to 8, in the illustrated embodiments, when the arch plate 120 is in an initial state in which no external force is applied thereon, the distance between the end surfaces of the two ends 120b of the arch plate 120 may be equal to, slightly smaller than or slightly larger than the distance between the two side walls 111b of the groove 111. In the illustrated embodiments, the size of the arch plate 120 in a second horizontal direction X perpendicular to the first horizontal direction Y is equal to the size of the groove 111 in the second horizontal direction X.

As shown in FIGS. 5 to 8, in the illustrated embodiments, the groove 111 runs throughout the base plate 110 in the second horizontal direction X perpendicular to the first horizontal direction Y, such that the size of the groove 111 in the second horizontal direction X is equal to the size of the base plate 110 in the second horizontal direction X. The bottom wall 111a of the groove 111 is parallel to a horizontal plane, and the two side walls 111b of the groove 111 are perpendicular to the horizontal plane.

As shown in FIGS. 5 to 8, in the illustrated embodiments, the base plate 110 and the groove 111 are both rectangular, the first horizontal direction Y is the length direction of the base plate 110, and the second horizontal direction X perpendicular to the first horizontal direction Y is the width direction of the base plate 110.

As shown in FIGS. 1 to 4, in another exemplary embodiment of the present disclosure, there is also provided an electronic device, which comprises the above described back plate assembly 100, an electronic component (200, 300, 400, 500) and a connection mechanism 10. The electronic component (200, 300, 400, 500) is placed on the arch plate 120 of the back plate assembly 100. The connection mechanism 10 is configured to mount the electronic component (200, 300, 400, 500) on the back plate assembly 100 and to apply a pressing or pressing force F1, which is directed in the vertical direction of the arch plate 120 of the back plate assembly 100, on the electronic component (200, 300, 400, 500).

As shown in FIGS. 1 to 4, in the illustrated embodiments, the electronic component (200, 300, 400, 500) includes a circuit board 200 that is in direct contact with the arch plate 120 of the back plate assembly 100. The horizontal tension F2 described above and shown in FIG. 8 prevents the back plate assembly 100 from deforming in the vertical direction and ensures that the back plate assembly 100 is in a horizontal state, so that the supported circuit board 200 can be effectively prevented from deforming in the vertical direction.

The electronic component (200, 300, 400, 500) further includes a socket connector 300, a central processing unit 400, and a heatsink 500 in the shown embodiment. The socket connector 300 is mounted on the circuit board 200. The central processing unit 400 is mounted on the socket connector 300. The heatsink 500 is mounted on the central processing unit 400.

The connection mechanism 10, as shown in FIGS. 1 to 4, comprises a bolt 11, a spring 12, and a nut 14. The nut 14 is fixed on the base plate 110 of the back plate assembly 100. The bolt 11 passes through a connection hole formed in a connection portion 510 of the heatsink 500 and a through hole formed in the circuit board 200, and is screwed with the nut 14. The spring 12 is sleeved on the rod of the bolt 11 and squeezed between the head of the bolt 11 and the connection portion 510 of the heatsink 500. The connection mechanism 10 includes a washer or spacer 13 supported on the connection portion 510 of the heatsink 500. The bolt 11 passes through the spacer 13, and the lower end of the spring 12 is supported on the washer or spacer 13.

As shown in FIG. 5, the base plate 110 has two opposite ends 112 in the first horizontal direction Y, and the thickness of the two ends 112 of the base plate 110 is greater than the thickness of the groove 111, and the nut 14 is fixed on the end 112 of the base plate 110.

As shown in FIGS. 1 to 8, in the illustrated embodiments, the electronic device comprises four connection mechanisms 10 that are located at four corners of the electronic device respectively. In the illustrated embodiments, the heatsink 500 is a fin type heatsink. However, the present disclosure is not limited to this, and the heatsink 500 can also be other types of heatsinks or radiators.

It will be understood by those skilled in the art that the above-described embodiments are exemplary and that modifications may be made by those skilled in the art, and that structures described in the various embodiments may be freely combined without conflict in structure or principle.

Although the present disclosure has been described in combination with the attached drawings, embodiments disclosed in the attached drawings are intended to provide an exemplary description of the preferred embodiments of the present disclosure, and should not be construed as a limitation of the present disclosure.

Although some embodiments under the general inventive concept of the disclosure have been shown and described, it would be appreciated by those of ordinary skills in the art that changes may be made in these embodiments without departing from the principles and spirit of the general inventive concept of the disclosure, the scope of which is defined by the claims and their equivalents.

It should be noted that the word such as "comprising", "comprise", or "include" does not exclude other elements or steps, and the word "a" or "an" does not exclude plural of objects referred to. In addition, any reference signs in the claims should not be construed as limiting the scope of the present disclosure.

What is claimed is:

1. An electronic device, comprising:
    a back plate assembly including a base plate formed with a groove having a bottom wall and a pair of side walls opposite to each other in a first horizontal direction, and an arch plate assembled into the groove and having a pair of opposite ends in the first horizontal direction, a pair of end surfaces of the ends of the arch plate abut against the side walls and a part of a middle portion of the arch plate between the ends is not in contact with the bottom wall of the groove and the arch plate having a length less than a length of the base plate when assembled into the groove;
    an electronic component including a circuit board having a bottom side placed directly on the arch plate; and
    a connection mechanism mounting the electronic component on the back plate assembly and applying a loading force on the electronic component directed in a vertical direction of the arch plate,
    wherein the electronic component includes a socket connector mounted on a top side of the circuit board directly opposite the arch plate, a central processing unit mounted on the socket connector, and a heatsink mounted on the central processing unit.

2. The electronic device of claim 1, wherein the connection mechanism includes a nut fixed on the base plate, a bolt passing through a connection hole formed in a connection portion of the heatsink and screwed with the nut, and a spring sleeved on a rod of the bolt and squeezed between a head of the bolt and the connection portion of the heatsink.

3. The electronic device of claim 2, wherein the connection mechanism includes a spacer supported on the connection portion of the heatsink, the bolt passes through the spacer and a lower end of the spring is supported on the spacer.

4. The electronic device of claim 2, wherein the base plate has a pair of opposite ends in a first horizontal direction, the nut is fixed on one of the ends of the base plate.

5. The electronic device of claim 1, wherein the heatsink is a fin type heatsink.

\* \* \* \* \*